United States Patent
Fossum et al.

(10) Patent No.: US 6,624,456 B2
(45) Date of Patent: Sep. 23, 2003

(54) FRAME SHUTTER PIXEL WITH AN ISOLATED STORAGE NODE

(75) Inventors: Eric R. Fossum, La Crescenta, CA (US); Sandor L. Barna, Pasadena, CA (US)

(73) Assignee: Micron Technology, Inc., Boise, ID (US)

( * ) Notice: Subject to any disclaimer, the term of this patent is extended or adjusted under 35 U.S.C. 154(b) by 157 days.

(21) Appl. No.: 09/792,634

(22) Filed: Feb. 23, 2001

(65) Prior Publication Data
US 2001/0035542 A1 Nov. 1, 2001

Related U.S. Application Data
(60) Provisional application No. 60/184,501, filed on Feb. 23, 2000.

(51) Int. Cl.[7] .............................................. H01L 27/146
(52) U.S. Cl. .................. 257/292; 257/223; 257/291; 257/294
(58) Field of Search ........................... 257/292, 223, 257/291, 294

(56) References Cited

U.S. PATENT DOCUMENTS

| | | | |
|---|---|---|---|
| 4,087,833 A | * 5/1978 | Tseng | 357/24 |
| 5,541,402 A | * 7/1996 | Ackland et al. | 250/208.1 |
| 5,587,596 A | * 12/1996 | Chi et al. | 257/223 |
| 5,869,857 A | 2/1999 | Chen | |
| 5,900,623 A | * 5/1999 | Tsang et al. | 250/208.1 |
| 6,025,210 A | * 2/2000 | Matsuda et al. | 438/60 |
| 6,069,376 A | 5/2000 | Merrill | |
| 6,087,686 A | * 7/2000 | Fox et al. | 257/233 |
| 6,160,281 A | * 12/2000 | Guidash | 257/292 |
| 6,160,282 A | * 12/2000 | Merrill | 257/292 |
| 6,215,113 B1 | 4/2001 | Chen et al. | |
| 6,218,692 B1 | 4/2001 | Guidash et al. | |
| 6,326,230 B1 | * 12/2001 | Pain et al. | 438/57 |
| 6,369,853 B1 | * 4/2002 | Merrill et al. | 348/302 |
| 6,380,572 B1 | * 4/2002 | Pain et al. | 257/292 |
| 2002/0011551 A1 | * 1/2002 | Nair | 250/208.1 |

FOREIGN PATENT DOCUMENTS

| JP | 9-275201 | * 10/1997 |
|---|---|---|

* cited by examiner

Primary Examiner—Nathan J. Flynn
Assistant Examiner—Ahmed N. Sefer
(74) Attorney, Agent, or Firm—Dickstein Shapiro Morin & Oshinsky LLP

(57) ABSTRACT

A frame shutter type device provides a separated well in which the storage node is located. The storage node is also shielded by a light shield to prevent photoelectric conversion.

39 Claims, 2 Drawing Sheets

FRAME SHUTTER PIXEL WITH AN ISOLATED STORAGE NODE

CROSS-REFERENCE TO RELATED APPLICATIONS

This invention claims priority under 35 U.S.C. 119/120 from provisional application Ser. No. 60/184,501 filed Feb. 23, 2000.

BACKGROUND

CMOS active pixel image sensors may be operated using a "rolling" shutter. Such a shutter operates by reading out each row of pixels, and then resetting that individual row, and then rolling to read and then reset the next row of pixels. Each pixel hence gets read and then reset at slightly different times. Hence, each pixel has a slightly different time of integration. Some applications, such as high-speed photography, may require more time consistency than is possible using this approach. Therefore, in these other applications, a frame shutter may be used. In the frame shutter mode, all pixels in the array have substantially identical integration start times and integration stop times.

A frame shutter technique, using a photogate pixel with two transfer gates, is shown in FIG. 1. A bridge diffusion isolates the photogate PG from the floating diffusion sense node (FD). Hence the charge in the photogate may be integrated and reset independently. The charge is stored in a storage node 110, which may also be independently reset. Bridge diffusion BD2 isolates the photogate from the storage node. A second bridge diffusion BD1 isolates the photogate collection area from a reset level Vaa. The charge level in the photogate collection area 100 may be transferred to a storage node 110 via transfer gate 105.

This isolation allows the integration regions of all the photogates in the entire array to be clocked globally. The same timing therefore exists for each of the plurality of pixels in the array. Moreover, the charge is preserved until the desired time of readout. This enables the active pixel sensor can be read out row by row, thereby allowing the same readout structure as is currently used.

SUMMARY

The present application teaches a new structure which isolates the storage node in order to provide a better image quality in the resultant structure.

BRIEF DESCRIPTION OF THE DRAWINGS

These and other aspects will now be described in detail with reference to the accompanying drawings, wherein.

DETAILED DESCRIPTION

Figure 1:
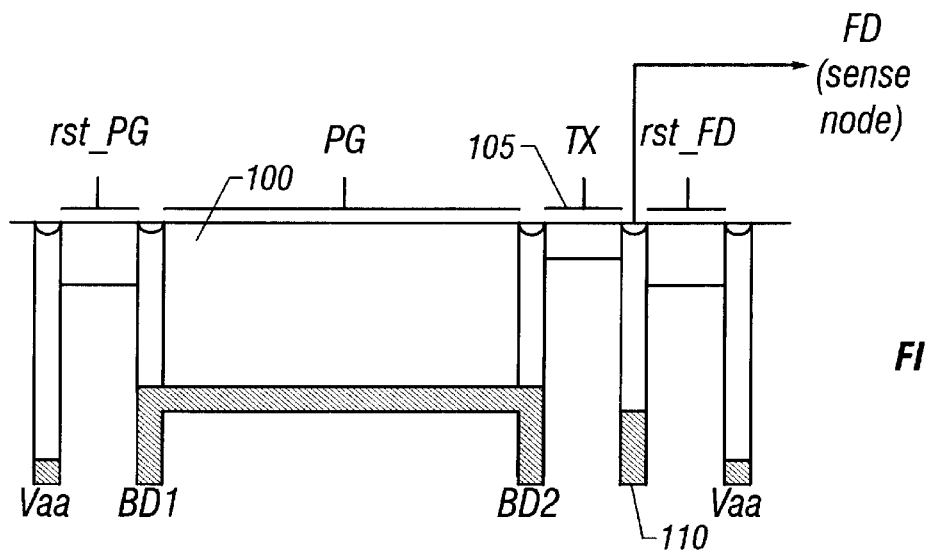
FIG. 1 shows a traditional photogate frame shutter.

The present inventors have recognized that a problem may occur with the conventional technique shown in FIG. 1. This problem may result from charge collection by the storage node 110. The storage node 110 may itself behave like a small photodiode. As such, the storage node 110 may collect some of the charge which is not collected by the photogate 100. This charge may be collected during the entire storage and/or readout time. This integration uses the rolling shutter type, providing a different readout period for each row of pixels. Hence, the entire storage time may typically be much longer than the desired frame shutter integration time. This leakage may correspond to image smear, and also may become more severe as the photogate size is reduced to make smaller pixel sizes.

According to the present system, embodiments of which are disclosed herein, the storage node is placed inside a protected area. For example, the storage node, which is the node that stores the photoelectrically induced signal, i.e. the charge from the photoreceptor after the charge integration time, may be placed inside an N type well that is protected by a light shield, e.g., a metal light shield. The shield has the effect of preventing a light induced signal from effecting the amount of charge stored in the storage node. The shield may prevent photons from converting into a photoelectric signal such as charge within the N well.

Any charge that is generated in the other regions of the pixel that diffuses to the N well boundary, will be swept into the well contact and hence will never reach the storage node. Of course, small leakage signals may still exist. The signals result primarily from photons which reach the N well as a result of multiple reflections. This is substantially reduced as compared with the kind of conventional system.

Figure 2A:
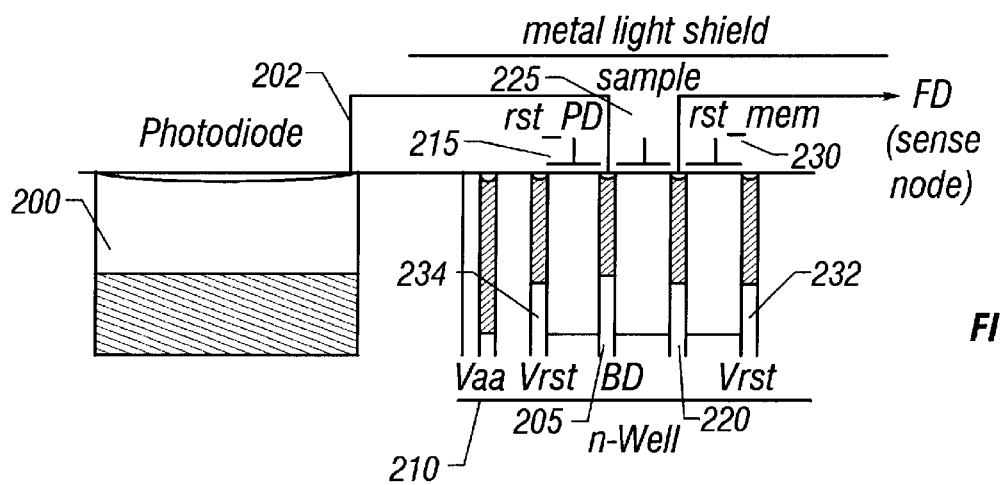
FIGS. 2A and 2B shows a first frame shutter with an isolated storage node with a photodiode.
Figure 2B:
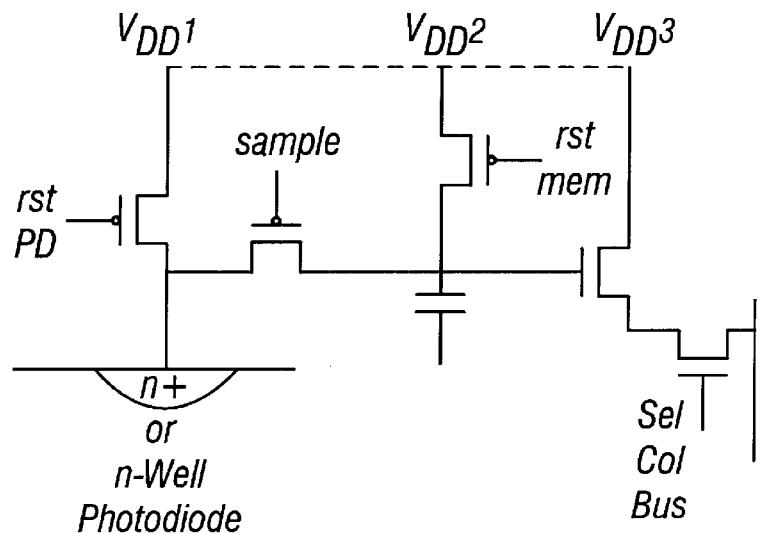

FIG. 2A show a first embodiment. FIG. 2A shows a well view of the embodiment, while FIG. 2B shows a transistor level circuit for this embodiment. The pixel in FIG. 2A shown while integrating, with both the photoreceptor 200 and floating diffusion sense node FD having been reset. The storage well 220 is still at its reset level; that is the level Vrst, as in the reset well 232.

N-well 210 isolates the wells, including storage well 220, from the receptor, here photodiode 200, in the substrate. The isolated wells may include reset diffusions 232, 234. The diffusion 234 is a photodiode reset, actuated via NMOS transistor 225. The floating diffusion reset well 232 is actuated via PMOS transistor 230.

The photodiode 200 may be a standard n type photodiode. This is electrically connected via 202 to a P-type bridge diffusion node 205 within n type well 210. The bridge diffusion receives charge from the photodiode.

The photodiode may be reset by lowering the voltage on the gate 215. This forces both the photodiode and bridge diffusion node 205 to the voltage Vrst. When the reset is removed, the photodiode 200 begins to integrate the incoming photoelectric signal. This reduces the voltage on both the photodiode 200, and the connected bridge diffusion node 205.

At the end of the integration period, the signal on the photodiode and bridge diffusion well 205 is sampled onto the storage type P node 220, by lowering the voltage on the sampling gate 225. The charge is transferred from the photodiode to the storage node in proportion to its relative capacitance. Later, the sample gate 225 is released, and the storage node 220 becomes isolated from any photoelectric current in bridge diffusion 205 by the sample gate 225. The storage node 220 is also isolated from photoelectric current in the substrate by the N well.

The stored value in the storage node 220 is read out in the traditional method of CMOS active pixel sensor read out.

After readout, the storage node 220 is reset to the reset value Vrst in well 232, using the reset memory gate 230. The stored voltage will be:

$$V_{stored} = V_{rst} - \frac{Q_{photons}}{C_{storage} + C_{bridge} + C_{pd}}$$

The conversion gain is based on the ratio of the storage capacitance to the total capacitance of the storage well 220+bridge diffusion 205+photodiode 200.

In practice, it is important to keep the charge injection substantially identical for each pixel. The charge injection can result from the raising of the voltage on the sample gate and to reset gates. Accurate control of the rise and fall times of the control signals can make sure that this charge injection stays constant.

Figure 3:
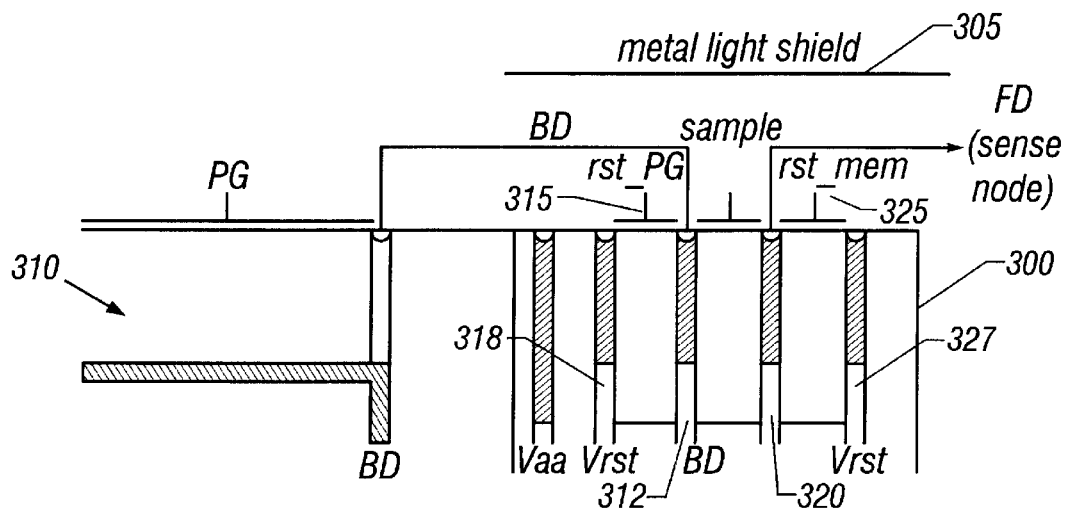
FIG. 3 shows a second frame shutter with an isolated storage node using a photogate.

An alternative embodiment is shown in FIG. 3. FIG. 3 shows a view of the wells of a single pixel during the integration time. In the FIG. 3 embodiment, a photogate is used as the photoreceptor.

Both the photogate (PG) and the storage node 320 for the floating diffusion sense node (FD) have been reset. The storage node 320 is shown at the reset level in FIG. 3.

N well 300 is located under a light shield 305, and the storage node 320 is isolated from the substrate by the N well, as in the embodiment of FIG. 2. In this embodiment, the photogate 310 is connected to bridge diffusion 312. The value of the photogate may be reset by activating PMOS gate 315, to connect the bridge diffusion and photogate to the photogate reset well 318, which is held at the reset level Vrst. Analogously, the storage node is reset by activating PMOS reset memory gate 325, bringing the storage node 320 to the reset level in storage node reset well 327.

This embodiment may use a photogate photoreceptor. The photogate allows charge to be collected over the same region as the photodiode pixel as described with reference to FIG. 2. However, conversion gain may be increased in some situations by lowering the voltage on the photogate in order to force any charge that is present into the bridge diffusions during both the reset of the collection region and during sampling. This may compensate for the capacitance of the photoreceptor, which capacitance can actually be quite significant. Accordingly, the stored voltage can be considered as:

$$V_{stored} = V_{rst} - \frac{Q_{photons}}{C_{storage} + C_{bridge}}$$

This system may therefore increase conversion gain. However, the photogate may have a lower quantum efficiency than the photodiode. Therefore, any advantages of the second embodiment may be offset by quantum efficiency disadvantages.

Figure 4:
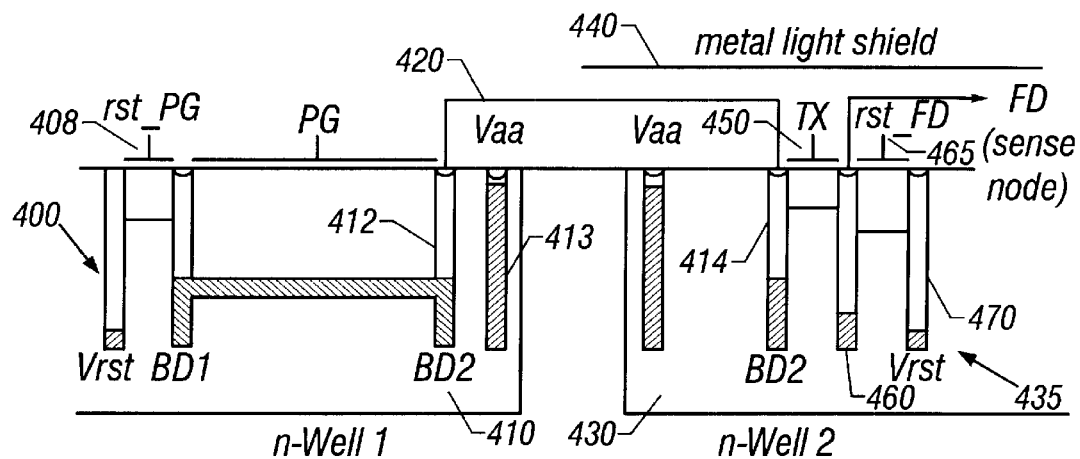
FIG. 4 shows an dual well embodiment.

Another embodiment shown in FIG. 4 forms separated wells, a first well 400 for the photoreceptor 405 and a second well 430 for the readout circuit 435. This device is shown in charge integration mode, having lower positions corresponding to lower voltages. Holes may be integrated under the photogate 405 to form charge which is stored in one of the bridge diffusions 412 within the photo gate. The photogate is located in the first well 410. In this embodiment, the photogate may be reset within the first N well 410. The photogate is reset by activating the gate 408 to bring the photogate level to the reset level Vrst. This has the effect of clearing the charge within the photogate 405 as well as the bridge diffusions 412 and 414. An anti blooming gate 413 may also be located within the first well 410.

The output of the photogate is connected by a wire 420 to the bridge diffusion 414 within the second N well 430. The charge may be transferred. The value in the bridge diffusions may also be transferred by the transfer gate 450 to the floating diffusion sensing node. The storage node 460 may be reset independently to the value in reset well 470 by activating the storage node reset gate 465.

In this embodiment, the gates are formed of P type MOS structures.

This pixel is operated in the same manner as the original photogate frame shutter, but with the signals converted to take into account the P type transistors. The conversion gain is:

$$V_{stored} = V_{rst} - \frac{Q_{photons}}{C_{storage}}$$

as in the above second embodiment, use of a photogate may reduce the quantum efficiency, and hence may offset some of the otherwise-obtained improvements.

Although only a few embodiments have been disclosed in detail above, other modifications are possible. For example, the photoreceptors as disclosed above could be other photoreceptor's besides the ones that are specifically disclosed. In addition, the sense of the semiconductor substrates, that is N type gates and P type gates could be reversed. The N type well could of course be replaced by a P type well.

All such modifications are intended to be encompassed within the following claims.

What is claimed is:

1. An apparatus, comprising:
   a semiconductor substrate;
   a photoreceptor, formed in said semiconductor substrate; and
   a semiconductor well, formed in said semiconductor substrate, and including at least a reset well and a storage node, said semiconductor well being separated from said photoreceptor, and said storage node being selectively coupled to receive a photoelectrically induced signal from said photoreceptor.

2. An apparatus as in claim 1, further comprising a light shield, shielding said storage node against receiving incoming light.

3. An apparatus as in claim 2, wherein said photoreceptor includes a photodiode.

4. An apparatus as in claim 2, wherein said photoreceptor includes a photogate.

5. An apparatus as in claim 2, wherein said photo electrically induced signal is charge.

6. An apparatus as in claim 1, further comprising, in said separated semiconductor well, a bridge diffusion, coupled to receive said photoelectrically induced signal from said photoreceptor, and a transfer gate, coupled between said bridge diffusion and said storage node, and activated to couple said photoelectrically induced signal from said bridge diffusion to said storage node.

7. An apparatus as in claim 6, further comprising a light shield, shielding said separated semiconductor well against incoming light.

8. An apparatus as in claim 7, wherein said semiconductor well is an N type well, and wherein said transfer gate is a P type gate.

9. An apparatus as in claim 8, wherein said photoreceptor is a photodiode which is an N well type photodiode.

10. An apparatus as in claim 7, wherein said reset well is a storage node reset well and said apparatus further comprises a storage node reset gate, selectively activated to connect said reset well to said storage node to reset a photoelectrically induced signal in said storage node.

11. An apparatus as in claim 10, further comprising a photoreceptor reset semiconductor well, biased to a reset level, and a photoreceptor reset gate, selectively activated to connect said photoreceptor and bridge diffusion to said photoreceptor reset semiconductor well to reset a value in said photoreceptor.

12. An apparatus as in claim 6, further comprising first and second reset structures, in said separated semiconductor well, said first reset structure operating to reset a value of said storage node, and said second reset structure operating to reset a value of said photoreceptor.

13. An apparatus as in claim 12, wherein said photoreceptor is a photodiode.

14. An apparatus as in claim 12, wherein said photoreceptor is a photogate, and further comprising a bridge diffusion within said photogate, isolating an output of said photogate.

15. An apparatus as in claim 14, further comprising an anti blooming gate, coupled to said photogate.

16. An apparatus as in claim 1, further comprising a light shield, shielding said separated semiconductor well against incoming light.

17. An apparatus as in claim 16, further comprising a second separated semiconductor well formed in said semiconductor substrate, said second separated semiconductor well including at least said photoreceptor therein.

18. An apparatus as in claim 17, further comprising a photoreceptor reset well in said second separated semiconductor well, and a photoreceptor transfer gate, selectively activated to connect a reset level in said photoreceptor reset well to said photoreceptor.

19. An apparatus as in claim 18, further comprising an anti blooming gate located within said second separated semiconductor well.

20. An apparatus as in claim 17, further comprising a first bridge diffusion within said separated semiconductor well, and a second bridge diffusion within said second separated semiconductor well.

21. An apparatus as in claim 20, further comprising a storage node reset well, maintaining a reset level, and located in said separated semiconductor well, and a storage node reset gate, also located within said first separated semiconductor well, activated to selectively connect said storage node to said reset level within said storage node reset well.

22. An apparatus, comprising:
a semiconductor substrate;
an array of photoreceptors, formed in said semiconductor substrate, each photoreceptor in the array forming a pixel circuit, and each pixel circuit including a photoreceptor portion, and a separated storage portion, separated from said photoreceptor portion, said storage portion being formed in a separated first semiconductor well, and each said separated first semiconductor well also including a light shielding portion which shields said storage portion against incoming light, said separated first semiconductor well also including a reset well, and including a first gate operating to reset said storage portion by selectively connecting said storage portion to a value in said reset well, and a second gate operating to reset an associated photoreceptor, by selectively connecting a value of said photoreceptor to a value in said reset well.

23. An apparatus as in claim 22, further comprising a bridge diffusion, within each said first semiconductor well, said bridge diffusion coupled to said photoreceptor, and further comprising a sampling gate between said bridge diffusion and said storage portion, activated to couple said photoelectrically induced signal from said bridge diffusion to said storage portion.

24. An apparatus as in claim 23, wherein said photoreceptors include photogates.

25. An apparatus as in claim 22, wherein said photoreceptors include photodiodes.

26. An apparatus as in claim 22, further comprising an anti blooming gate, coupled to an associated photoreceptor, and operating to prevent said associated photoreceptor from accumulating photoelectrically induced signal that is greater than a specified amount.

27. An apparatus as in claim 22, wherein said light shield portion is a metal light shield.

28. An apparatus as in claim 22, wherein said separated first semiconductor well is an N type well.

29. An apparatus, comprising:
a semiconductor substrate;
a first semiconductor well in said semiconductor substrate, said first semiconductor well including a photoreceptor therein; and
a second semiconductor well, separated from said first semiconductor well, and located in said semiconductor substrate, said second semiconductor well including a reset well and a storage node, said storage node being selectively connected to receive photoelectrically induced signal from said photoreceptor in said first semiconductor well.

30. An apparatus as in claim 29, further comprising a light shield, associated with said second semiconductor well, and shielding at least part of said second semiconductor well against reception of incoming light.

31. An apparatus as in claim 29, further comprising a bridge diffusion in said second semiconductor well, and coupled to said photoreceptor, and a transfer gate, coupled between said bridge diffusion and said storage node, and selectively activated to couple said photoelectrically induced signal from said bridge diffusion to said storage node.

32. An apparatus of claim 29, wherein said reset well is biased to a reset level, and a reset gate, which is activated to couple said reset well to said storage node to reset a value of said storage node.

33. An apparatus as in claim 29, further comprising a photoreceptor reset structure, operative to reset a value of said photoreceptor.

34. An apparatus as in claim 33, wherein said photoreceptor reset structure is located in said first semiconductor well.

35. An apparatus as in claim 34, wherein said photoreceptor reset structure includes a reset well, which is biased at a reset level, and a photoreceptor reset gate, coupled between said reset well and said photoreceptor, and which is activated to couple said reset well to said photoreceptor.

36. An apparatus as in claim 29, wherein said photoreceptor includes a photogate.

37. An apparatus, comprising:
a semiconductor substrate;
a plurality of pixels located in said semiconductor substrate, each of said plurality of pixels comprising:
a) a photoreceptor;
b) a separated semiconductor well, formed of a semiconductor type which separates said semiconductor well from said substrate, and including:
i) a light shield, shielding said separated semiconductor well against incoming light;

ii) a reception node, connected to and receiving a value indicative of photo electrically induced signal from the photoreceptor;
iii) a storage node, separated from said reception node; and
iv) a transfer gate, coupled between said reception node and said storage node, and activated in each of said plurality of pixels substantially simultaneously to transfer signal from said photoreceptor in each of said plurality of pixels to said storage node in each of said plurality of pixels; and c) first and second reset gates, a first reset gate controlling reset of a value in said photoreceptor, and a second reset gate controlling reset of a value in said storage node.

38. An apparatus as in claim 37, wherein said first and second reset gates are each located within said separated semiconductor well.

39. An apparatus as in claim 37, wherein one of said first and second reset gates are located within said separated semiconductor well, and the other of said first and second reset gates is not located within said separated semiconductor well.

* * * * *